US008269562B1

(12) United States Patent
Staab

(10) Patent No.: US 8,269,562 B1
(45) Date of Patent: Sep. 18, 2012

(54) OPEN-LOOP TRANSIMPEDANCE AMPLIFIER FOR INFRARED DIODES

(75) Inventor: David R. Staab, Los Gatos, CA (US)

(73) Assignee: IXYS CH GmbH (CH)

( * ) Notice: Subject to any disclaimer, the term of this patent is extended or adjusted under 35 U.S.C. 154(b) by 1846 days.

(21) Appl. No.: 11/479,037

(22) Filed: Jun. 30, 2006

(51) Int. Cl.
*H03F 3/08* (2006.01)
(52) U.S. Cl. ............................... 330/308; 330/288
(58) Field of Classification Search .................. 330/308, 330/288; 323/315, 316
See application file for complete search history.

(56) References Cited

U.S. PATENT DOCUMENTS

| 6,583,671 B2* | 6/2003 | Chatwin ...................... 330/279 |
| 7,332,971 B2* | 2/2008 | Dasgupta et al. ............. 330/308 |
| 7,382,191 B2* | 6/2008 | Randlett ....................... 330/254 |
| 2007/0194846 A1* | 8/2007 | Randlett ....................... 330/254 |

OTHER PUBLICATIONS

David Johnson, "Amplifier Circuits: Transimpedance", in Discover Circuits, Sep. 15, 2005 and Dec. 18, 2004 (3 pages); from www.discovercircuits.com/A/a-transimp.htm.
"Current-to-Voltage Amplifier" in eCircuit Center, Jun. 13, 2006 printout (3 pages); from www.ecircuitcenter.com/circuits/opitov/opitov.htm.
National Semiconductor product folder for LMC6482, CMOS Dual Rail-to-Rail Input and Output Operational Amplifier, Oct. 7, 2005 printout (1 page).
Bob Pease, "What's All This Transimpedance Amplifier Stuff, Anyhow? (Part 1)", in Electronic Design, Jan. 8, 2001 (6 pages); from www.elecdesign.com/articles/articleID/4346/4346.html.
"Transimpedance Amplifier" entry in Wikipedia Encyclopedia, Mar. 21, 2006 (1 page); from http://en.wikipedia.org/wiki/Transimpedance_amplifier.
"IR Learning Remote Control Application Note (Appendix II)", application note of Zilog, Inc., 2002, doc ANXXXXRR-1102 (1 page).

* cited by examiner

*Primary Examiner* — Henry Choe
(74) *Attorney, Agent, or Firm* — Imperium Patent Works; T. Lester Wallace

(57) ABSTRACT

A microcontroller integrated circuit includes an open-loop transimpedance amplifier (OLTA). An input lead of the OLTA is a terminal of the microcontroller. The cathode of a photodiode is connected to VDD and the anode is connected to the terminal. The OLTA maintains the photodiode in a strongly reverse-biased condition, thereby keeping diode capacitance low and facilitating rapid circuit response. The input of the OLTA involves a diode-connected field effect transistor that provides a low impedance. This low impedance decreases as the diode current increases, thus providing effective clamping of the voltage on the terminal. By this clamping, the amount of photodiode capacitance discharging necessary when transitioning from a high input current condition to a low input current condition is reduced, thereby further improving amplifier response time. The OLTA is small and consumes less than thirty microamperes and functions to mirror photodiode current and compare to a predetermined level.

11 Claims, 7 Drawing Sheets

INPUT CURRENT
(FIRST LOGIC LEVEL OF ZERO)
(SECOND LOGIC LEVEL OF 100 MICROAMPS)

INPUT CURRENT
(FIRST LOGIC LEVEL OF ZERO)
(SECOND LOGIC LEVEL OF 10 MILLIAMPS)

OPEN-LOOP TRANSIMPEDANCE AMPLIFIER FOR INFRARED DIODES

TECHNICAL FIELD

The described embodiments relate to infrared receiver circuits, and more particularly to an infrared receiver circuit that is fully integrated onto a microcontroller integrated circuit within a learning remote control device.

BACKGROUND INFORMATION

Manufacturers of electronic consumer devices (for example, televisions, radio tuners, home theatre and entertainment systems, digital video disc (DVD) players, video cassette recorders (VCR), compact disc (CD) players, set-top cable television boxes, set-top satellite boxes, video game controllers, home appliances, etc.) typically supply an infrared remote control device along with each electronic consumer device. Such an infrared remote control device is often a handheld battery-powered device with a set of keys and an infrared (IR) transmitter. The remote control device can control the associated electronic consumer device by sending an appropriate infrared operational signal to the electronic consumer device. The operational signal carries a key code. Each such key code corresponds to an associated function of the selected electronic consumer device. Such functions may include power on/off, volume up, volume down, play, stop, select, channel advance, channel back, etc.

If, for example, an individual in the home wishes to increase the volume of a television, then the individual presses the "volume up" key on the remote control device for the television. Circuitry in the remote control device detects the key press condition, accesses appropriate key code and modulation information stored in the remote control device, and uses the key code and modulation information to generate an appropriate control signal that is used to drive an infrared light emitting diode (LED). This control signal causes the LED to transmit the infrared operational signal to an infrared receiver in the television. The key code is carried by the operational signal. The infrared receiver in the television receives the infrared operational signal, detects the key code, and takes an action that is appropriate for the key code. In the present example where the "volume up" key was pressed, the appropriate action is to increase the audio output volume of the television.

A typical user in the home may have many different electronic consumer devices that are to be controlled. A user may, for example, have a digital video disc (DVD) player and a television. To view a movie on a DVD, the user may have to power on and control the DVD with a first remote control device that issues operational signals that the DVD player responds to. In addition, the user may have to power on and control the television with a second remote control device that issues operational signals that the television responds to. It is desired to reduce the number of remote control devices in this situation to one such that a single remote control device is usable to control both electronic consumer devices (the DVD player and the television).

A type of remote control device referred to as a "learning remote control device" may be employed to replace both remote control devices in the exemplary situation described above. The learning remote control device has infrared receiver circuitry as well as conventional infrared transmitter circuitry. The learning remote control device is placed such that the infrared receiver of the learning remote control device can receive infrared operational signals transmitted from one of the remote control devices to be replaced. A key on the remote control device to be replaced is then pressed. The infrared receiver in the learning remote receives the infrared operational signal and stores information about the operational signal such that the learning remote control device can later regenerate the operational signal using the infrared transmitter circuitry of the learning remote control device. This process of detecting and storing information that is usable to regenerate an operational signal is called "learning".

After the learning remote control device has learned how to regenerate operational signals output from one remote control device to be replaced, the learning remote control device learns how to regenerate operational signals output from another remote control device to be replaced. Thereafter, the user can use the learning remote control device to emulate either the first or the second remote control device. The user controls which of the two remote control devices will be emulated by changing a mode of the learning remote control device. The learning remote control device is therefore now usable to control the both electronic consumer devices in the home, thereby replacing the multiple manufacturer-supplied remote control devices.

The circuitry in the learning remote control device generally includes a microcontroller integrated circuit, an infrared photodiode, and an infrared receiver circuit. The infrared receiver circuit receives a signal from the infrared photodiode and outputs a digital output signal onto a serial input terminal of the microcontroller integrated circuit. The infrared receiver circuit is typically a fairly expensive circuit that consumes a substantial amount of power when it is functioning. Traditional techniques involve realizing the infrared receiver in discrete circuit components (including discrete resistors and/or capacitors) located outside the microcontroller integrated circuit. In one example, the infrared receiver circuit includes multiple operational amplifier gain stages, each including a feedback loop having resistors. The operational amplifier circuit consumes three hundred microamperes or more when it is receiving an infrared signal from an infrared photodiode. In another example, a cascode bipolar transistor amplifier circuit involves multiple resistors and a capacitor in a biasing network. If either of these traditional infrared receiver circuits were to be integrated into the microcontroller integrated circuit, then the resistors and capacitors and/or the complex operational amplifier circuitry would consume an undesirably large amount of die area, thereby increasing the cost of the microcontroller integrated circuit. Accordingly, integrating an infrared receiver circuit onto a microcontroller integrated circuit that is to see general usage in non-learning remote control devices can be recognized to be unacceptably expensive. Moreover, the hundreds of microamperes of power consumed by such a traditional infrared receiver would be undesirable. An improved microcontroller integrated circuit that has an improved, fully-integrated infrared receiver is desired.

SUMMARY

It is recognized that the high sensitivity afforded by conventional photocurrent operational amplifier circuits is unnecessary in a learning remote control device where the remote control device from which an infrared operational signal is to be learned is generally placed in close proximity to the photodiode of the learning remote control device. In addition, the photodiode in a learning remote control device involves a parasitic capacitance. Ordinary amplifier circuits used in learning remote control devices to amplify photocurrents can have significant input impedances can therefore be slow in discharging the photodiode's parasitic capacitance, thereby contributing to slow response times.

A novel microcontroller integrated circuit is disclosed that includes a novel open-loop transimpedance amplifier (OLTA). An input node of the OLTA is an input terminal of the microcontroller. In one embodiment, when the microcontroller is used in a learning remote control device, the cathode of a photodiode external to the microcontroller integrated circuit is connected to a supply voltage VDD and the anode of the photodiode is connected to the input terminal. The photodiode supplies a photocurrent onto the input terminal of the microcontroller (and therefore onto the input node of the OLTA). If the input photocurrent is less than a "trip point input current" (for example, due to dark conditions), then the OLTA forces a digital output signal DATA on an OLTA output lead to a digital logic high value. If the input photocurrent is more than the "trip point input current" (for example, due to the infrared photodiode receiving infrared radiation from an operational signal), then the OLTA forces the signal DATA to a digital logic low value.

The OLTA includes a diode-connected N-channel transistor circuit as an input stage. The diode-connected N-channel transistor circuit biases the voltage on the input terminal under dark conditions (photodiode not activated by light) at approximately one N-channel transistor Vt (threshold voltage) above ground potential. Because the cathode of the photodiode is coupled to VDD and the anode is coupled to the input terminal, the photodiode is biased in a strongly reverse-biased condition. Keeping the photodiode strongly reverse-biased minimizes the parasitic capacitance of the photodiode and thereby facilitates fast response times of the OLTA.

The diode-connected N-channel transistor of the input stage of the OLTA also causes the input terminal of the microcontroller to have a low input impedance. In one example, the input impedance is forty ohms or less when input currents of eight milliamperes of more are being received into the input terminal.

In another novel aspect, the input impedance of the input terminal decreases as the diode current flowing into the terminal increases, thus providing effective clamping of the voltage on the input terminal of the microcontroller. The input voltage on the input terminal is clamped for photocurrents over a wide dynamic range (for example, from zero photocurrent to approximately 10 milliamperes of photocurrent). By this clamping, less discharging of photodiode parasitic capacitance when transitioning from a high input current condition to a zero input current condition is required, thereby further improving amplifier response time. The OLTA involves no feedback loop, no large resistors and/or capacitors and/or operational amplifiers, and therefore can be integrated into a small die area. In one example, the OLTA: 1) is realized in 20,000 square microns of integrated circuit die area, and 2) consumes less than 30 microamperes of supply current when receiving a photodiode input current signal having an amplitude of greater than 100 microamperes and having a signal rate from zero of up to at least five hundred kHz. The OLTA functions over a wide supply voltage range and it requires no voltage references or power supply voltage dividers.

Further details and embodiments are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
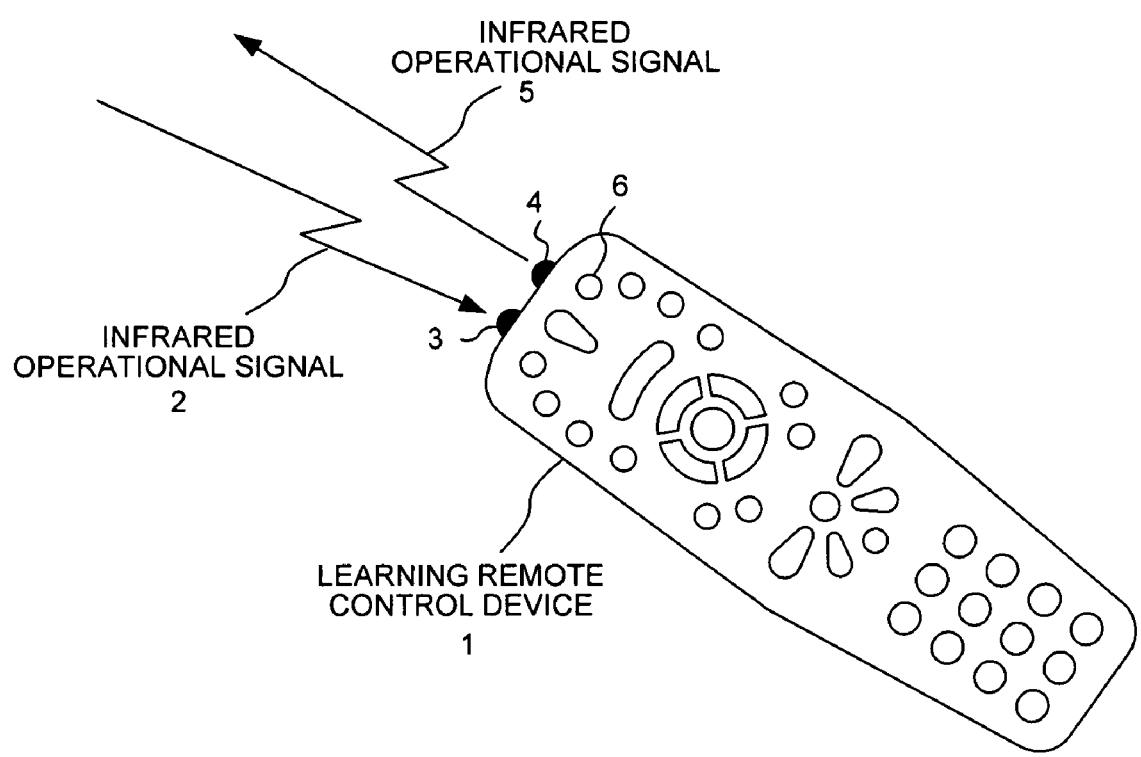
FIG. 1 is a diagram of a learning remote control device that includes a photodiode 3 and a novel microcontroller integrated circuit (the microcontroller integrated circuit is contained in the plastic enclosure of the remote control device). The novel microcontroller integrated circuit includes a novel OLTA (open-loop transimpedance amplifier) in accordance with one novel aspect.

FIG. 1 is a diagram of a learning remote control device 1 that includes a novel microcontroller integrated circuit. Learning remote control device 1 is usable to receive and "learn" an infrared operational signal 2 transmitted from another infrared remote control device. Operational signal 2 is received by an infrared photodiode 3. The novel microcontroller integrated circuit (not shown in FIG. 1) is disposed within the plastic housing of the learning remote control device 1. The microcontroller integrated circuit is coupled to infrared photodiode 3 as explained in further detail below. Learning remote control device 1 also includes infrared transmitter circuitry and an infrared light emitting diode (LED) 4 for transmitting an infrared operational signal 5. An infrared operational signal that is "learned" by learning remote control device 1 in association with a key 6 can be regenerated and transmitted from learning remote control device 1 at a later time by pressing key 6 when learning remote control device 1 is in an appropriate mode of operation.

An infrared operational signal can be "learned" in the sense that timing information on when the received operational signal transitions low and high is stored and then the microcontroller later uses this timing information to regenerate a facsimile of the received operational signal. Alternatively, an infrared operational signal can be "learned" by detecting when the received operational signal transitions low and high and then by using this information to search a group codesets to identify which codeset contains information for generating an operational signal having similar high and low transition timing. Once the proper codeset is identified, then the microcontroller uses a key code and modulation information and other information in the codeset to regenerate the operational signal.

Figure 2:
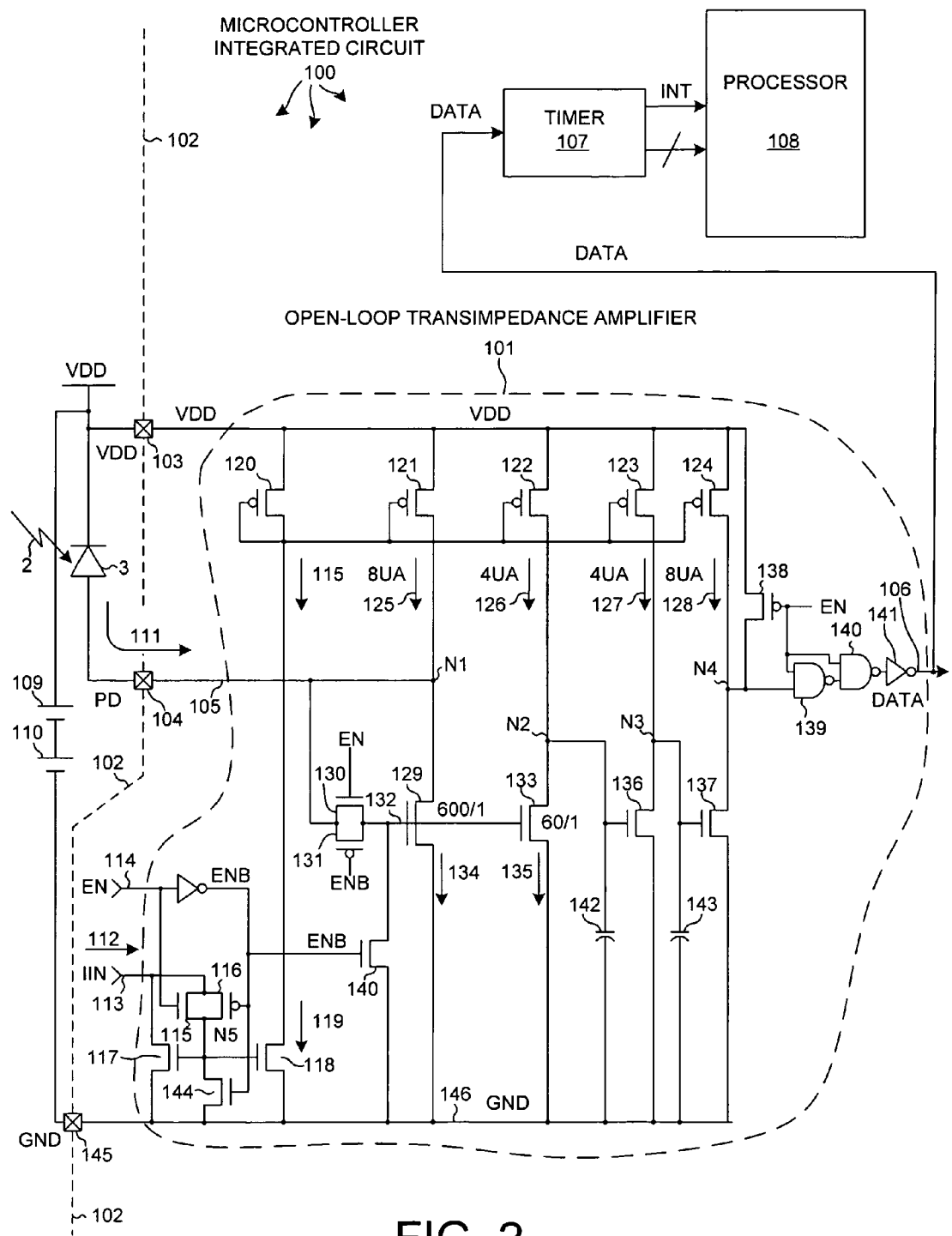
FIG. 2 is a circuit diagram showing the photodiode 3 of FIG. 1 coupled to the novel OLTA 101 within microcontroller integrated circuit 100.

FIG. 2 is a simplified circuit diagram showing the incoming infrared operational signal 2, infrared photodiode 3, and a novel microcontroller integrated circuit 100 that includes a novel open-loop transimpedance amplifier (OLTA) 101. The vertical dashed line 102 in FIG. 2 represents a boundary of microcontroller integrated circuit 100. The cathode of diode 3 is coupled to a power supply (VDD) terminal 103 of microcontroller integrated circuit 100. The anode of diode 3 is coupled to photodiode current input terminal (PD) 104. An input lead 105 of OLTA 101 is directly coupled to an input terminal (PD) 104 of the microcontroller and to an OLTA input node N1. In the illustrated specific embodiment, an output lead 106 of OLTA 101 is coupled to a data input lead of a timer 107. A digital processor 108 reads and controls timer 107, thereby obtaining timing information about when the various edges of a digital signal passing into the timer 107 occurred. Timer 107 and processor 108 are specific to the particular embodiment depicted here. Other suitable circuitry for interfacing a digital processor of a microcontroller to a photocurrent amplifier circuit that outputs a digital signal can be employed. In the example of FIG. 2, microcontroller integrated circuit 100 and photodiode 3 are powered by two AA batteries 109 and 110. The proper operating range of the supply voltage VDD between supply terminal 103 and ground terminal 145 is from 1.8 volts to 3.6 volts.

Input terminal 104 has an input impedance less than forty ohms when an input current 111 of eight milliamperes or more is flowing into input terminal 104. OLTA 101 has a non-linear IV (current-to-voltage) characteristic. As the input current 111 increases, the voltage on input node N1 increases proportional to the square root of the input current increase. Accordingly, the input impedance decreases as input current 111 (in an input current operating range) increases. The input current operating range in the example of FIG. 2 extends from zero microamperes (when no infrared signal is being received onto diode 3) to approximately ten milliamperes (when a strong infrared signal is being received onto diode 3). Because the input impedance decreases more rapidly than the input current increases over this input current range, the voltage on PD input terminal 104 is effectively clamped to an input voltage range of less than approximately 0.7 volts for levels of input current 111 in the normal input current operating range (from zero to 10 milliamperes) of the circuit. If input current 111 is less than a "trip point input current" of approximately 32.0 microamperes, then a digital logic zero signal is output onto output lead 106. If input current 111 is more than the "trip point input current", then a digital logic high value is output onto output lead 104. This 32.0 microampere trip point input current level is referred to here as the "sensitivity" of the amplifier. The higher the trip point input current level, the less "sensitive" the amplifier is said to be. In one advantageous aspect, OLTA 101 has a sensitivity less than 20 microamperes (the "trip point input current" is higher than 20 microamperes) but nonetheless functions acceptably in the application of "learning" an infrared operational signal emitted from a remote control device.

OLTA 101 receives a 0.67 microampere bias current (IIN) 112 on a bias current input lead 113 from elsewhere on the microcontroller integrated circuit. If OLTA 101 is enabled by virtue of an enable signal (EN) on enable input lead 114 being a digital logic high, then the pass-gate formed by transistors 115 and 116 is conductive. The bias current 112 that flows through N-channel transistor 117 is mirrored and multiplied by twelve by the current mirror formed by N-channel transistors 117 and 118. A mirrored current 119 of approximately 8.0 microamperes therefore flows through N-channel transistor 118. This mirrored current 119 also flows through P-channel transistor 120. The 8.0 microamperes of current 119 flowing through P-channel transistor 120 is in turn mirrored by P-channel mirroring transistors 121-124 into four corresponding mirrored currents 125-128. The relative sizes of P-channel transistors 121-124 to P-channel transistor 120 determines the relative magnitudes of the currents 125-128. In the example of FIG. 2, the four currents 125-128 are 8.0 microamperes, 4.0 microamperes, 4.0 microamperes, and 8.0 microamperes, respectively.

Dark Condition Operation:

In operation, when there is a dark condition (substantially no infrared radiation is being received by diode 3) and diode photocurrent 111 is approximately zero, then substantially no current is flowing into input terminal 104 and to node N1. The 8.0 microamperes of current 125 from P-channel transistor 121 therefore flows from drain to source through a so-called "diode-connected N-channel transistor" 129.

Diode-connected N-channel transistor 129 is not a real diode in the sense that a real diode or a diode-connected bipolar transistor has adjacent oppositely doped semiconductor regions and has an exponential current-to-voltage relationship for forward voltages across the junction. Rather, diode-connected N-channel transistor 129 is an N-channel transistor whose drain is connected to its gate to form a two terminal device. The gate-drain node is a first terminal. The source node is a second terminal. In an N-channel transistor in the saturation region of operation, the drain current is roughly proportional to the square to the gate-to-source voltage when a forward gate-to-source voltage on the transistor is greater than a threshold voltage (Vth). Accordingly, if the drain and gate of an N-channel transistor are connected as a so-called "diode-connected N-channel transistor", and if a forward current is made to flow from drain to source through the transistor, then increases in the drain current will roughly be proportional to the square of the corresponding increases in gate-to-source voltage. Due to this operation, which is similar to the operation of a real diode in some respects, an N-channel transistor used in this way whose drain is connected to its gate is referred to here as a "diode-connected N-channel transistor".

In OLTA 101 of FIG. 2, transistors 130 and 131 form a passgate. This passgate is conductive when the enable signal EN is a digital logic high. The gate 132 of N-channel transistor 129 is therefore connected by the passgate to the transistor's drain at node N1. The body of N-channel transistor 129 is coupled to ground potential. Due to the action of P-channel pullup transistor 121, the gate-to-source voltage across diode-connected N-channel transistor 129 is approximately the threshold voltage (approximately 0.5 volts) of N-channel transistor 129. N-channel transistor 129 therefore conducts the drain current supplied by P-channel transistor 121. Further increases in forward drain current 134 (above the drain current at which transistor 129 begins to conduct) result in much smaller gate-to-source voltage increases. As set forth above, in a diode-connected N-channel transistor the drain current increases proportionally to the square of the increase in gate-to-source voltage. Diode-connected N-channel transistor 129 therefore functions to bias the voltage on input terminal 104 to approximately one threshold voltage (approximately 0.5 volts) above ground potential on ground conductor 146.

The 8.0 microamperes of current 134 flowing through input transistor 129 due to P-channel transistor 121 is mirrored by a current mirror formed by N-channel transistors 129 and 133. Input transistor 129 has a width/length ratio of 600/1 whereas mirroring transistor 133 has a width/length ratio of 60/1. Mirrored current 135 flowing through transistor 133 is therefore one tenth as small as current 134. Current 135 is therefore 0.8 microamperes. Because P-channel transistor 122 is to supply the 4.0 microampere current 135 into node N2 and because N-channel transistor 133 only sinks 0.8 microamperes of current 135 to ground, the voltage on node N2 is pulled high. The voltage on node N2 increases until the drain of P-channel transistor 122 increases to the point that transistor 122 no longer acts as a current mirror.

When the voltage on node N2 is adequately high, N-channel transistor 136 becomes conductive. N-channel transistor 136 can sink more than 4 microamperes of current to ground potential, so transistor 136 being made, conductive overdrives P-channel transistor 123 and pulls the voltage on node N3 to a digital logic low. When the voltage on node N3 falls, N-channel transistor 137 is made non-conductive. P-channel transistor 124 therefore pulls the voltage on node N4 upward until the drain of P-channel transistor 124 increases to the point that transistor 124 no longer acts as a current mirror. When the enable signal EN is a digital logic high, P-channel transistor 138 is non-conductive and digital logic high values are present on the upper input leads of NAND gates 139 and 140. The digital logic high on node. N4 is therefore inverted by NAND gate 139, is again inverted by NAND gate 140, and is inverted again by inverter 141. The resulting digital logic low value is output as digital signal DATA onto OLTA output lead 106.

Input Current Trip Point Operation:

If 32.0 microamperes of photocurrent 111 is flowing into PD input terminal 102 and to node N1, then this photocurrent adds to the 8.0 microamperes of current 125 such that current 134 flowing through diode-connected N-channel transistor 129 is 40.0 microamperes. Due to the operation of the current mirror of transistors 129 and 133, mirrored current 135 is one tenth of 40.0 microamperes or 4.0 microamperes. This 4.0 microamperes of current 135 matches the 4.0 microamperes of current 126 supplied by P-channel transistor 122. If current 135 is any greater than 4.0 microamperes, then the voltage on node N2 will be pulled down and OLTA 101 will force the output signal DATA to a digital logic high value. If current 135 is any smaller that 4.0 microamperes, then the voltage on node N2 will be pulled up and OLTA 101 will force the output signal DATA to a digital logic low value. Accordingly, 32.0 microamperes of input current 111 represents the input current trip point between outputting a digital logic low value of signal DATA (representing a dark condition) onto OLTA output lead 106 and outputting a digital logic high value of signal DATA (representing an infrared radiation detected condition) onto OLTA output lead 106.

Infrared Radiation Detected Condition:

When adequate infrared radiation is detected by diode 3, then input photocurrent 111 has a magnitude that exceeds 32.0 microamperes. Consider a situation where the input photocurrent is 100 microamperes. 108 microamperes are therefore flowing into node N1, and current 134 flowing through diode-connected N-channel transistor is 108.0 microamperes. Mirrored current 135 is therefore 10.8 microamperes. N-channel transistor 133 overdrives the current mirror of transistor 122. Node N2 is therefore pulled to ground potential. The low voltage on the gate of N-channel transistor 136 makes N-channel transistor 136 non-conductive such that P-channel transistor 123 pulls the voltage on node N3 high. The voltage on node N3 stops rising when P-channel transistor 119 is saturated and is no longer acting as a current mirror. The high voltage on node N3 makes N-channel transistor 137 adequately conductive that it overdrives the current mirror of P-channel transistor 124. The voltage on node N4 is therefore below the switching voltage of NAND gate 139. The digital logic low on the lower input lead of NAND gate 139 is inverted three times by NAND gate 139, NAND gate 140 and inverter 141 such that a digital logic high value of the signal DATA is output onto output lead 106.

Figure 3:
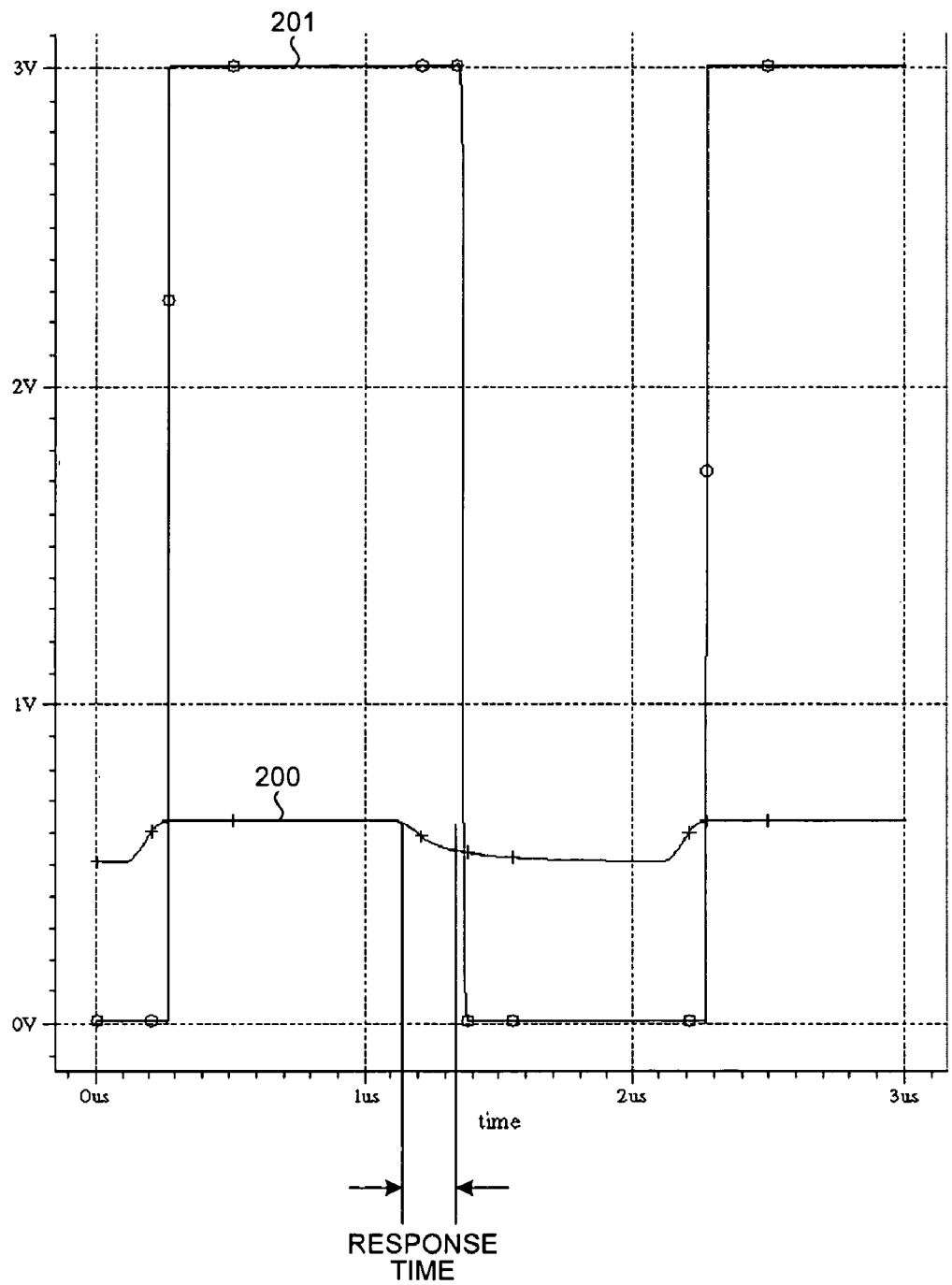
FIG. 3 is a waveform diagram showing operation of the OLTA of FIGS. 1 and 2 when a photodiode input current having a digital amplitude of 100 microamperes flows into the OLTA.

FIG. 3 is a waveform diagram. Waveform 200 represents the voltage on input terminal 104 when an input current 111 having a digital logic low level of zero amperes and a digital logic high level of 100 microamperes is supplied onto OLTA input lead 105. Waveform 201 represents the resulting DATA signal output onto OLTA output lead 106.

When diode 3 is highly illuminated with infrared radiation, diode 3 can output a significant amount of current. In the present example, diode 3 can output ten milliamperes or more. The photodiode has a parasitic capacitance between its cathode and anode terminals. If a traditional infrared photocurrent amplifier circuit having a high input impedance were directly connected to the cathode terminal of diode 3, and if the infrared amplifier circuit were a voltage detecting device, then when diode 3 suddenly switched from a highly illuminated condition to a dark condition, the voltage on the input node of the amplifier would remain on the input node due to the capacitance of the diode 3 itself. Only as the voltage on the input node decays to the voltage trip point of the infrared receiver circuit would the amplifier receiver circuit detect the dark condition. The result would be a slow response time of the infrared amplifier receiver circuit when going from an illuminated condition to a dark condition. The slow response time is made worse under conditions of very high illumination. Due to the substantial input impedance of the infrared receiver circuit, the high diode current corresponding to the very high illumination would cause the voltage on the input of the receiver circuit to rise a significant amount. When the diode suddenly stops outputting photocurrent due to a dark condition, the high-voltage on the input of the receiver circuit would have to discharged down to the trip point of the receiver circuit before the receiver circuit could detect a dark condition. The higher the voltage on the input node, the longer it would take to discharge the diode capacitance on the input of the receiver circuit.

PD input terminal 104, however, has a low input impedance. When diode current 111 falls rapidly upon a transition from an illuminated diode condition to a dark diode condition, the low input impedance of terminal 104 facilitates discharging of the diode capacitance through the input terminal 104 and thereby decreases amplifier response time. In the example of FIG. 2, the input impedance of input terminal 104 is less than forty ohms when an input current 111 of eight milliamperes or more is flowing into input terminal 104.

Not only is response time decreased due to the low input impedance of input terminal 104, but OLTA 101 also decreases response time by preventing large voltages on input terminal 104 during high diode current conditions. As set forth above, transistor 129 is a diode-transistor N-channel transistor having a non-linear IV (current to voltage) characteristic. Due to this IV characteristic, a large increase in current 111 gives rise to only a small increase in the voltage on node N1. At a first approximation, the current 111 increases as the square of the voltage on node N1 (a diode-connected field effect transistor is sometimes referred to as a "square-law device"). Accordingly, the voltage on node N1 does not increase linearly even with large magnitudes of diode current 111. In the example of FIG. 2 where the highest diode input current 111 under normal operating conditions is approximately 10 milliamperes, the voltage on input terminal 104 (and on input node N1) is clamped to be in a range between 0.5 volts and approximately 1.2 volts. Because the voltage on the input terminal is clamped under high diode current conditions, only a relatively low voltage on the input terminal 104 need be discharged in order for OLTA 101 to detect a dark condition. As illustrated in FIG. 3, the response time from when input current 111 begins to decrease from its high current level to its low current level until the OLTA digital output signal DATA begins to transition from a digital high to a digital low is approximately 0.20 microseconds.

Figure 4:
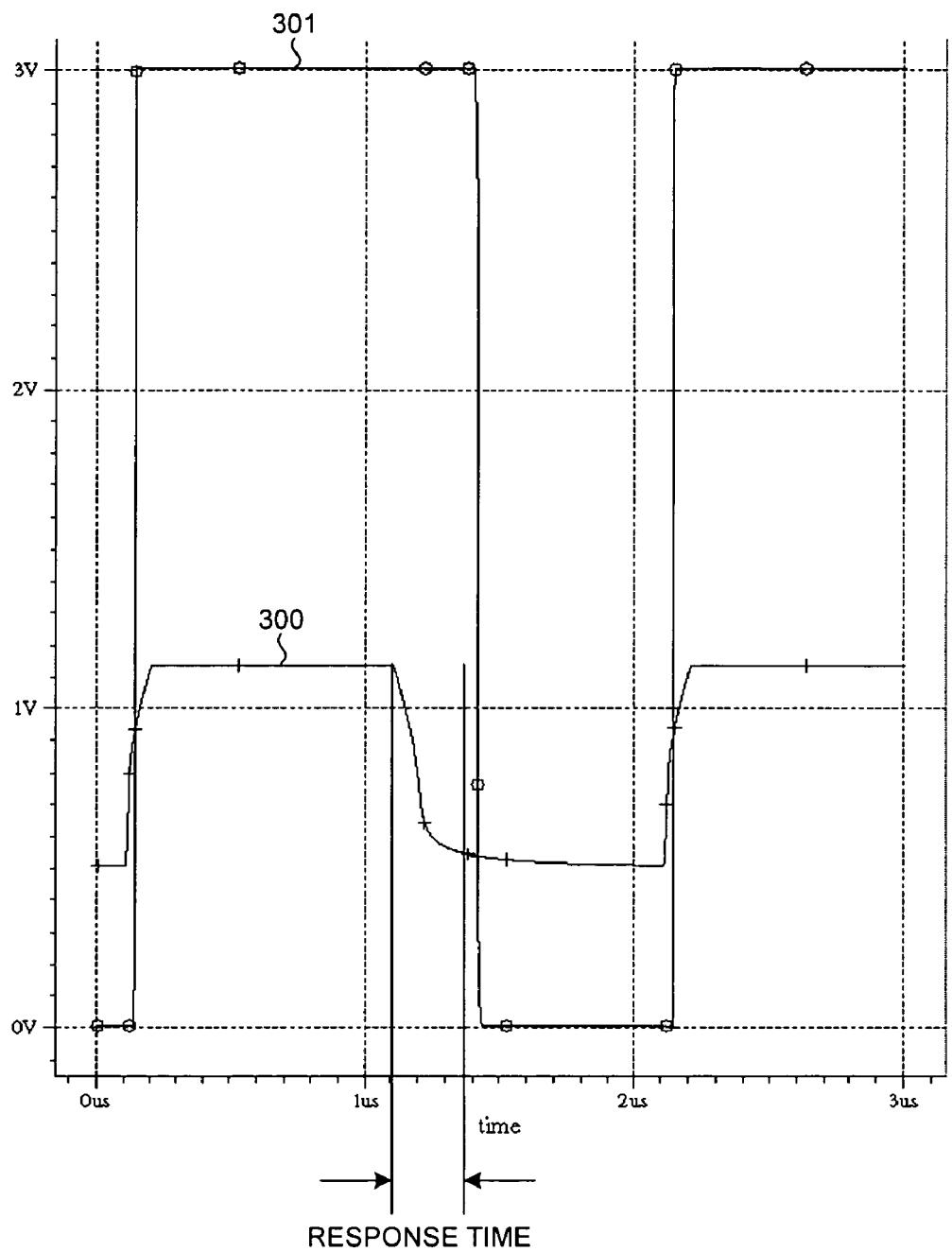
FIG. 4 is a waveform diagram showing operation of the OLTA of FIGS. 1 and 2 when a photodiode input current having a digital amplitude of 10 milliamperes flows into the OLTA.

FIG. 4 is a waveform diagram that shows the voltage 300 on input terminal 104 when input current signal 111 has a first current level of zero amperes and a second current level of 10 milliamperes. Waveform 301 represents the resulting digital signal DATA on output lead 106. When FIGS. 3 and 4 are compared, it is noted that: 1) a zero input current condition results in 0.5 volts on input terminal 104; 2) a 100 microampere input current condition results in 0.63 volts on input terminal 104; and 3) a 10 milliampere input current condition results in 1.13 volts on input terminal 104. Accordingly, a digital input current signal having a 100 microampere digital amplitude on input terminal 104 results in a 0.13 volt digital amplitude signal on input terminal 104. A digital input current signal having a 10 milliampere (100 times higher than 100 microamperes) digital amplitude on input terminal 104 results in a 0.63 volt digital amplitude signal on input terminal 104 (only about 4.5 times higher than 0.13 volts). This non-linear input impedance of input terminal 104 allows for faster recovery to the no signal level (i.e., dark condition) than a fixed resistive input impedance would allow for. As illustrated in FIG. 4, the response time from when input current 111 begins to decrease from its high current level (the 10 milliampere level) until the OLTA digital output signal DATA begins to transition from its digital high level is approximately 0.25 microseconds.

Figure 5:
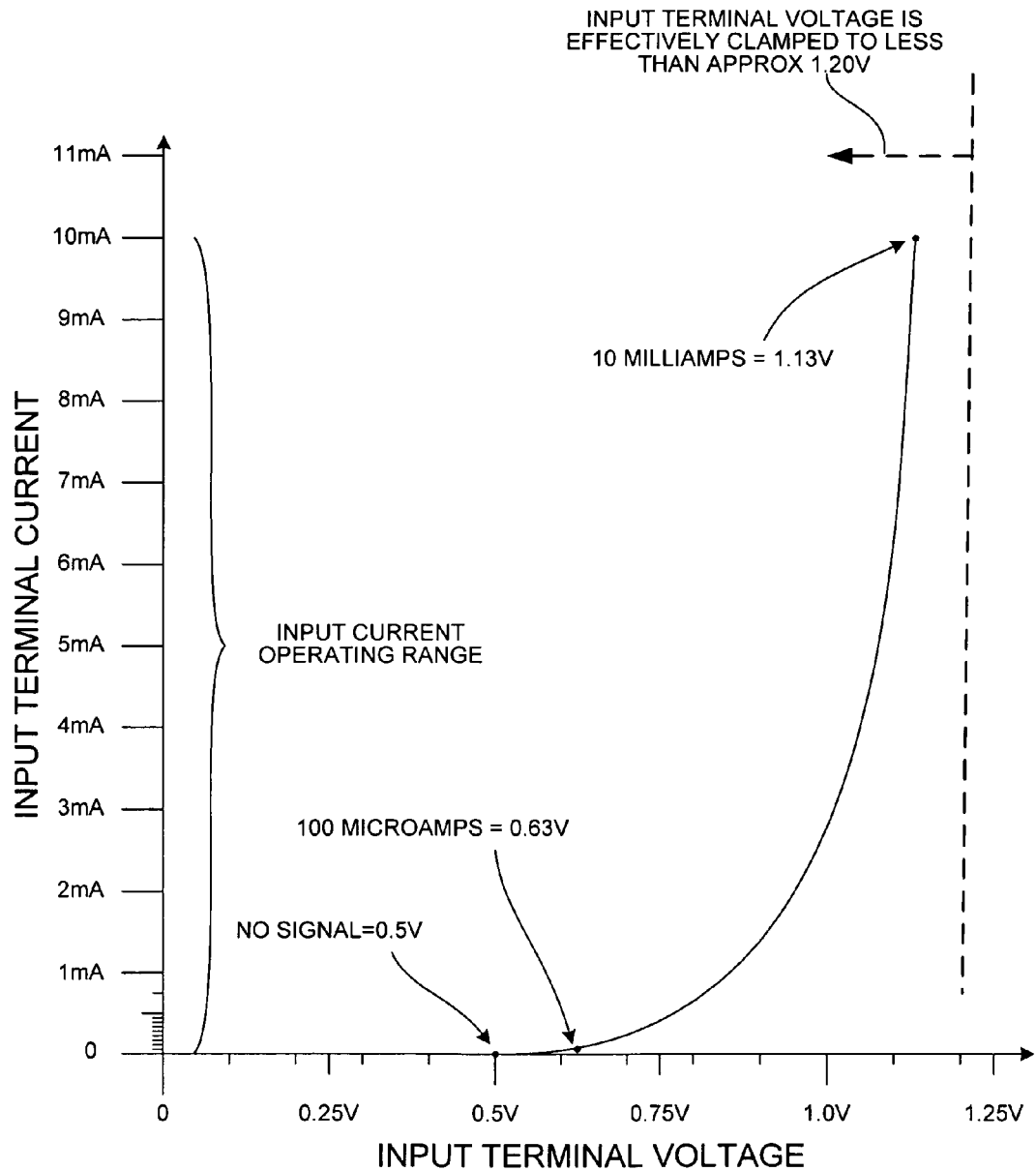
FIG. 5 is a diagram of an IV (current-to-voltage) input characteristic of the OLTA of FIGS. 1 and 2.

FIG. 5 is a diagram showing an IV characteristic of OLTA 101 of FIG. 2. OLTA 101 has a input current operating range from a minimum input current value of approximately zero milliamperes to a maximum input current value of approximately 10 milliamperes. Due to the non-linear current-to-voltage characteristic of OLTA 101, the input voltage on input terminal 104 is effectively clamped to less than 1.2 volts as illustrated. As the diode current 111 increases, the drain voltage on diode-connected transistor 129 increases very little past the threshold voltage of transistor 129. Input transistor 129 clamps the voltage on node N1 to a reasonable level even if tens of milliamps of photocurrent are flowing into terminal 104. This is important because transistor 129 functions to pull the voltage on node N1 back down when the diode current 111 falls at the beginning of a dark condition. Because diode-connected transistor 129 is a square-law device, the voltage on node N1 is pulled down faster than if a simple fixed resistance (that is practical for an amplifier in this application) were used.

In one advantageous aspect, OLTA 101 involves no resistors or capacitors that if realized in integrated form would consume large amounts of die area. OLTA 101 includes no bipolar transistors and is realized in integrated form in 20,000 square microns in a standard 0.5 micron CMOS process. In contrast to traditional infrared diode receiver circuits involving operational amplifiers, OLTA 101 involves no feedback loop. In operation, not all of current-mirroring P-channel transistors 121-124 are sourcing the indicated currents because some of the nodes N1-N4 are at high voltage levels and the associated current sources are current starved. In contrast to a typical infrared diode operational amplifier receiver circuit that may consume 300 microamperes or more, OLTA 101 of FIG. 2 consumes less than 30 microamperes when receiving a 500 KHz digital input current signal having a 100 microampere amplitude. The reference here to "a 100 microampere amplitude" means the input signal, has a first current level that corresponds to zero milliamperes of input current and has a second current level that corresponds to 100 microamperes of input current. Capacitors 142 and 143 are optional and may be included in OLTA 101 to provide a measure of noise filtering such that short-lived changes in input current 111 do not pass through OLTA 101 and appear on output lead 106. Capacitors 142 and 143 may, for example, be 0.5 picofarad capacitors.

Disable:

When OLTA 101 is not being used to "learn" an operational signal, OLTA 101 is disabled to stop OLTA from consuming power. Processor 108 may, for example, write to an OLTA enable bit in a control register. The value of the OLTA enable bit determines the digital logic value of the enable signal EN on input lead 114. If the enable signal EN is a digital logic low, then the passgate formed by transistors 115 and 116 is non-conductive and N-channel transistor 144 is conductive. N-channel transistor 144 being conductive couples node N5 to ground potential, thereby disabling the current mirror formed by transistors 117 and 118. Current 119 is cut to zero. In addition, the passgate formed by transistors 130 and 131 is made non-conductive, thereby decoupling the gate 132 of transistor 129 from node N1. Rather than coupling the gate 132 of transistor 129 to the drain of transistor 129, the gate 132 is coupled through conductive transistor 140 to ground potential. Grounding the gate 132 of transistor 129 makes transistor 129 non-conductive and cuts the currents 134 and 135 to zero, thereby conserving power. When the enable signal EN is a digital low, P-channel transistor 138 is enabled, thereby coupling node N4 and the lower input lead of NAND gate 139 to supply voltage VDD. The output signal DATA on output lead 106 is therefore maintained at a digital logic low value.

Figure 6:
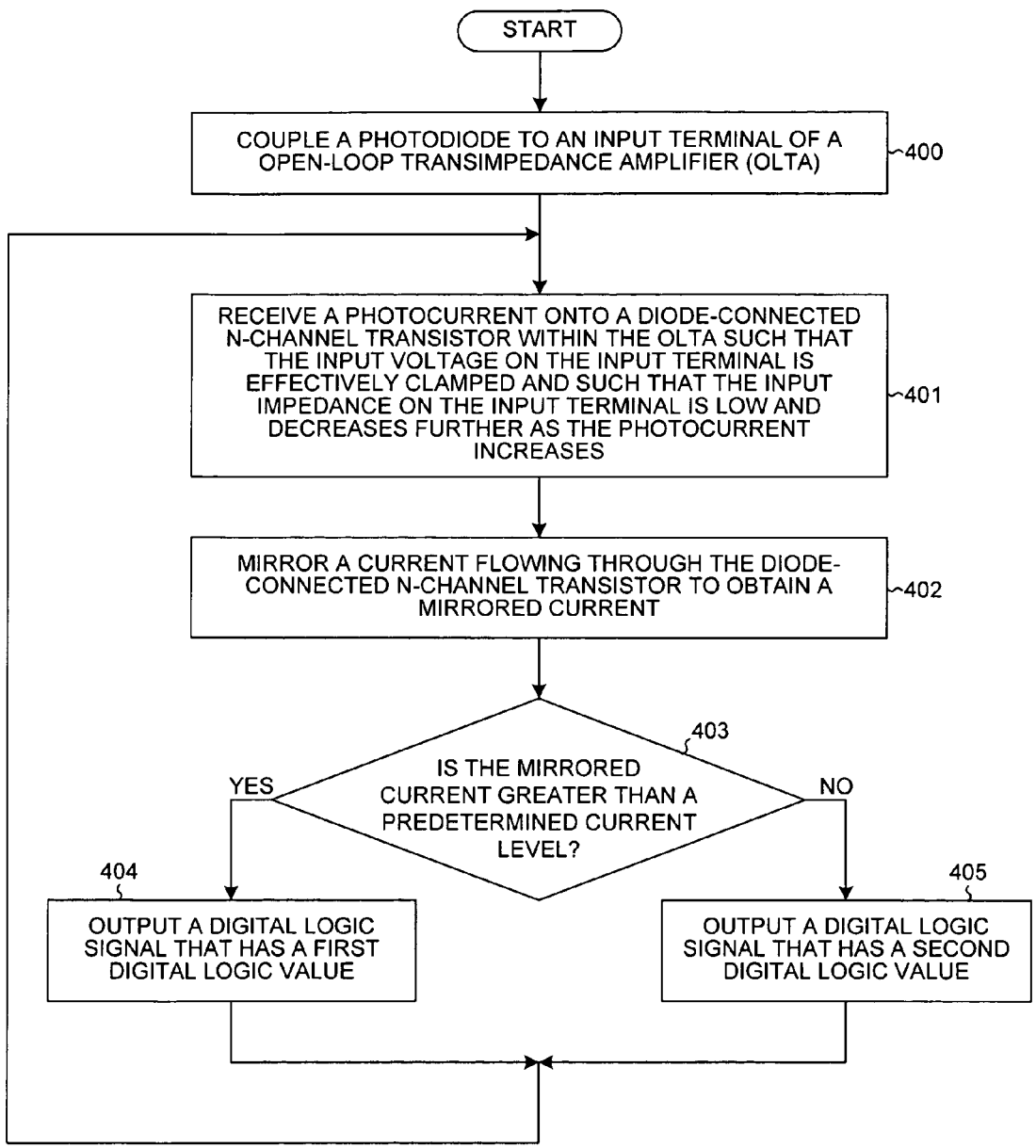
FIG. 6 is a flowchart of a method in accordance with one novel method.

FIG. 6 is a flowchart of a method in accordance with one novel aspect. Initially (step 400), a photodiode is coupled to an input terminal of an open-loop transimpedance amplifier (OLTA). In one example, this photodiode is photodiode 3 of FIG. 2 and the input terminal is input terminal 104 of microcontroller integrated circuit 100. A photocurrent from the photodiode is received (step 401) onto a diode-connected N-channel transistor within the OLTA. In one example, this diode-connected N-channel transistor is transistor 129 of FIG. 2. Operation of the diode-connected N-channel transistor effectively clamps the voltage on the input terminal. In the example of FIG. 2, the voltage on input terminal 104 is clamped within a range of approximately 0.7 volts (0.5 volts to 1.2 volts) for photocurrents in an input photocurrent operating range (from zero microamperes to ten milliamperes). The diode-connected N-channel transistor causes the input terminal to have a low input impedance that decreases with increases in the photocurrent. A current flowing through the diode-connected N-channel transistor is mirrored (step 402) to obtain a mirrored current. In the example of FIG. 2, the current 134 flowing through diode-connected transistor 129 is mirrored by transistor 133 to produce mirrored current 135. If the mirrored current is greater than a predetermined current (step 403), then the OLTA output signal DATA has a first digital logic value (step 404). In the example of FIG. 2, if mirrored current 135 is greater than the predetermined current level of 4 microamperes flowing through P-channel transistor 122, then OLTA outputs a digital logic high value onto output lead 106. If the mirrored current is not greater than the predetermined current (step 403), then the OLTA output signal DATA has a second digital logic value (step 405). In the example of FIG. 2, if mirrored current 135 is not greater than the predetermined current level of 4 microamperes flowing through P-channel transistor 122, then OLTA outputs a digital logic low value onto output lead 106.

Figure 7:
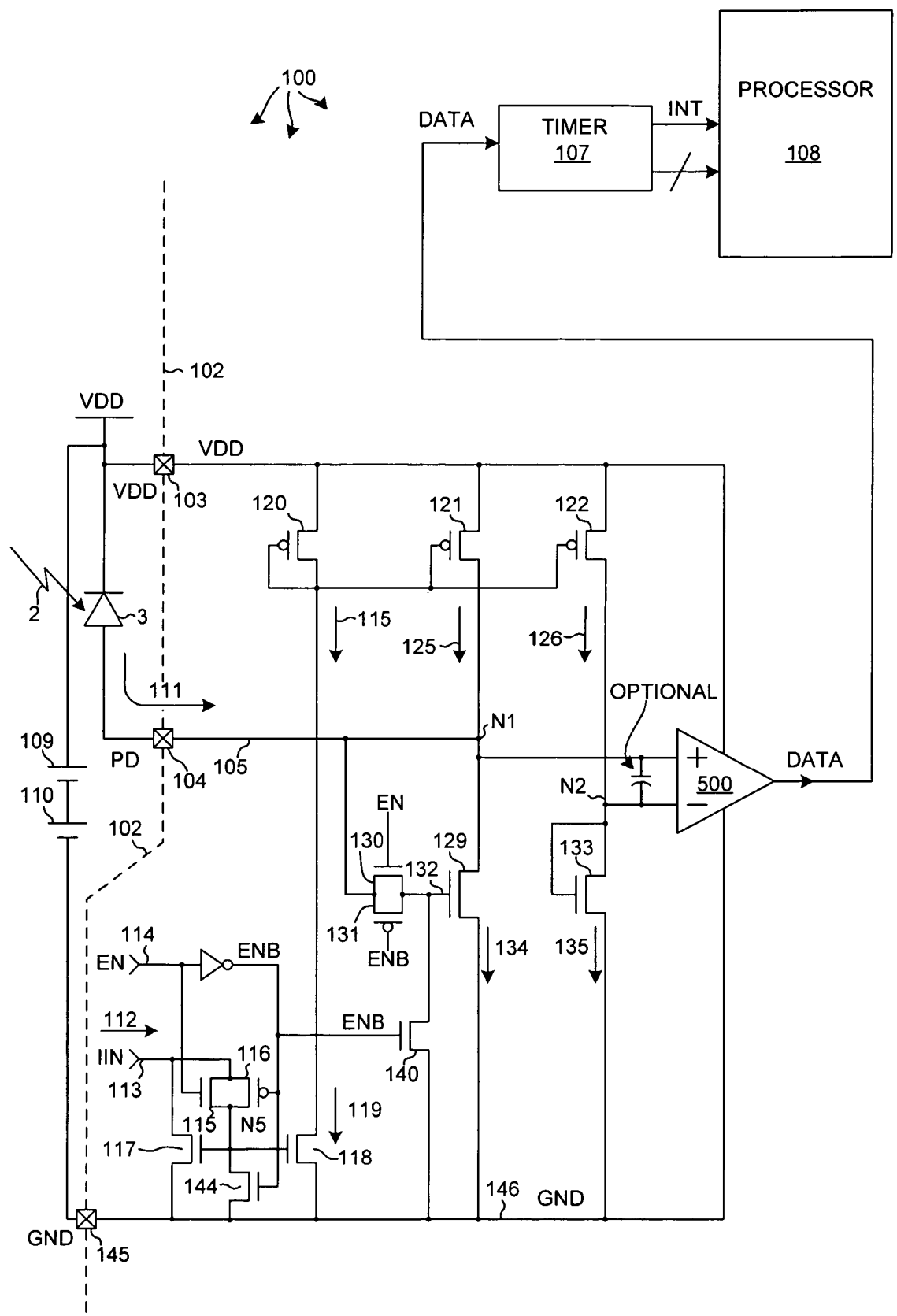
FIG. 7 is a circuit diagram of another embodiment.

FIG. 7 is a circuit diagram of another embodiment. Rather than using transistor 133 to mirror the current 134 flowing through the diode-connected N-channel transistor 129 as in the circuit of FIG. 2, transistor 133 is also diode-connected as illustrated in FIG. 7. The current 126 flowing through transistor 133 does not change with changes in photocurrent 111. The voltage on node N2 is therefore substantially fixed. The voltage on node N1, however, does change slightly with changes in photocurrent 111 as explained above in connection with FIG. 2. The currents 125 and 126 and/or the sizes of transistors 129 and 133 are chosen such that the voltages on nodes N1 and N2 are identical when the photocurrent 111 flowing into input terminal 104 is the desired "trip point input current". An open-loop voltage comparator 500 compares the voltages on nodes N1 and N2. If the voltage on node N1 is higher than the voltage on node N2 (a high photocurrent condition), then comparator 500 forces signal DATA to a digital logic high value. If the voltage on node N1 is lower than the voltage on node N2 (a low photocurrent condition), then comparator 500 forces signal DATA to a digital logic low value.

Although certain specific embodiments are described above for instructional purposes, the teachings of this patent document have general applicability and are not limited to the specific embodiments described above. Although OLTA 101 of FIG. 2 has a single "trip point input current" for detecting both low-to-high input current transitions and for high-to-low input current transitions, the OLTA in another embodiment has a first "trip point input current" for detecting low-to-high input current transitions and has a second "trip point input current" for detecting high-to-low input current transitions. Numerous techniques for providing hysteresis can be employed. For example, the digital signal on node N4 can be used to switch in an additional P-channel current mirror that supplies additional current to node N2 (in addition to current 126) such that the total current supplied to node N2 is different depending on whether the voltage on node N4 is high or low.

In one embodiment, the "trip point input current" is adjusted based on the photocurrent level. For example, where the photocurrent level is detected to be high, the trip point input current is adjusted to be a higher trip point input current. Using this higher trip point input current improves amplifier response time because the parasitic capacitance of the photodiode need not be discharged as far (when transitioning from a high photocurrent condition to a low photocurrent condition) in order for the voltage on node N1 corresponding to the trip point input current to be reached. The amplifier can therefore detect the low photocurrent condition more rapidly due to the trip point input current having been adjusted higher. The OLTA is usable to realize a reduced current-consumption sleep mode in which receiving of the beginning of an infrared signal can wake-up a device such as a microcontroller from the sleep mode. One way to accomplish this is by selectively reducing currents through selected ones of the P-channel current sources. The OLTA is more sensitive in the sleep mode. After waking up, standard P-channel current source selections would be enabled to receive the remainder of the infrared signal or another infrared signal. The photodiode and OLTA can be integrated onto the same integrated circuit die. Although an OLTA is set forth above where the photodiode is coupled between VDD and the input of the amplifier, another example of the OLTA involves a photodiode coupled between the input of the amplifier and ground. In such a case, the N-channel transistors of the OLTA are replaced with P-channel transistors, and the P-channel transistors of the OLTA are replaced with N-channel transistors. Accordingly, various modifications, adaptations, and combinations of various features of the described embodiments can be practiced without departing from the scope of the invention as set forth in the claims.

What is claimed is:

1. A microcontroller integrated circuit comprising:
an input terminal; and
an open-loop transimpedance amplifier (OLTA) having an input node and an output node, wherein the input node is coupled to the input terminal of the microcontroller integrated circuit, the input node having an input impedance less than approximately forty ohms if an input current of eight milliamperes or more is flowing into the input node, wherein the input impedance decreases as the input current in an input current operating range increases, wherein the input impedance decreases more rapidly than the input current increases such that a voltage on the input terminal is effectively clamped to an input voltage range of less than approximately 0.7 volts for input currents in the input current operating range, wherein the OLTA outputs a digital logic signal indicative of whether the input current is in a first low input current range or is in a second high input current range.

2. The microcontroller integrated circuit of claim 1, wherein the input current operating range extends from zero milliamperes to at least eight milliamperes.

3. The microcontroller integrated circuit of claim 2, wherein the OLTA consumes less than thirty microamperes when receiving an input current signal, wherein the input current signal has a first current level and a second current level, and wherein the input current signal has a signal rate from zero of up to at least five hundred kHz.

4. The microcontroller integrated circuit of claim 1, wherein the OLTA comprises:
an N-channel transistor having a drain, a gate, and a source, wherein the drain is coupled to the input node of the OLTA, wherein the source is coupled to a ground conductor; and
a passgate that is controllable to couple the gate of the N-channel transistor to the drain of the N-channel transistor.

5. The microcontroller integrated circuit of claim 4, wherein the OLTA further comprises:
a current source that supplies a first current onto the input node of the OLTA, wherein if no current is flowing into the microcontroller integrated circuit through the input terminal and if the OLTA is enabled then the current flows from the current source, through the input node, and then from the input node and through the N-channel transistor to the ground conductor.

6. The microcontroller integrated circuit of claim 1, wherein the OLTA comprises:
a diode-connected N-channel transistor that biases the voltage on the input terminal of the OLTA.

7. The microcontroller integrated circuit of claim 1, wherein the OLTA has an input current sensitivity less than 20 microamperes.

8. The microcontroller integrated circuit of claim 1, further comprising:
a VDD supply voltage terminal; and
a ground terminal, wherein one or more batteries supplies a supply voltage onto the VDD supply voltage terminal with respect to a ground potential on the ground terminal, and wherein an anode of a photodiode is coupled to the VDD supply voltage terminal, and wherein a cathode of the photodiode is coupled to the ground terminal.

9. The microcontroller integrated circuit of claim 1, wherein the OLTA comprises:
a current source that supplies a first current to the input node of the OLTA;

an first N-channel transistor that has a drain coupled to the input node of the OLTA, a source coupled to a ground conductor, and a gate;

a passgate that is controllable to be conductive or non-conductive, wherein when the passgate is conductive the gate of the first N-channel transistor is coupled to the input node of the OLTA, wherein when the passgate is non-conductive the gate of the first N-channel transistor is not coupled to the input node of the OLTA;

a second N-channel transistor that is controllable to couple the gate of the first transistor to ground the ground conductor; and a digital processor that can cause a digital enable signal to have a first digital logic level or a second digital logic level, wherein if the digital enable signal has the first digital logic level then the passgate is controlled to be conductive and the second N-channel transistor does not couple the gate of the first transistor to the ground conductor, whereas if the digital enable signal has the second digital logic level then the passgate is controlled to be non-conductive and the second N-channel transistor couples the gate of the first transistor to the ground conductor.

10. The microcontroller integrated circuit of claim 9, wherein the OLTA further comprises:

a second current source that supplies a second current onto a second node; and a third N-channel transistor that has a drain that is coupled to the second node, a source that is coupled to the ground conductor, and a gate that is coupled to the gate of the first N-channel transistor.

11. The microcontroller integrated circuit of claim 10, wherein the first and second current sources are disabled when the digital enable signal has the second digital logic level.

* * * * *